United States Patent [19]
Gondou et al.

[11] Patent Number: 4,665,507
[45] Date of Patent: May 12, 1987

[54] SEMICONDUCTOR MEMORY HAVING LOAD DEVICES CONTROLLED BY A WRITE SIGNAL

[75] Inventors: Takafumi Gondou; Eiichi Amada, both of Kodaira; Kenichi Asano, Mitaka, all of Japan

[73] Assignees: Hitachi, Ltd.; Hitachi Micro Computer Engineering, Ltd., both of Tokyo, Japan

[21] Appl. No.: 724,765

[22] Filed: Apr. 18, 1985

[30] Foreign Application Priority Data

Apr. 20, 1984 [JP] Japan ............... 59-79615
Jun. 1, 1984 [JP] Japan ............... 59-110718

[51] Int. Cl.[4] .................................. G11C 7/00
[52] U.S. Cl. .................. 365/190; 365/194; 365/203; 365/227
[58] Field of Search ........... 365/227, 203, 230, 189, 365/190, 194, 233

[56] References Cited

U.S. PATENT DOCUMENTS 4,300,213  11/1981  Tanimura et al. ............... 365/190

FOREIGN PATENT DOCUMENTS 0027489  2/1982  Japan ............... 365/189
0001883  1/1983  Japan ............... 365/227
0091591  5/1983  Japan ............... 365/227

Primary Examiner—James W. Moffitt
Assistant Examiner—Glenn A. Gossage
Attorney, Agent, or Firm—Antonelli, Terry & Wands

[57] ABSTRACT

To reduce the power dissipation of a static random access memory, a write enable signal is applied to the gates of load MOS transistors on bit lines which are connected to a memory cell. During the write-in time, the load MOS transistors are turned off so as to prevent as electric current from flowing from a power source into the earth through the memory cell.

3 Claims, 3 Drawing Figures

SEMICONDUCTOR MEMORY HAVING LOAD DEVICES CONTROLLED BY A WRITE SIGNAL

BACKGROUND OF THE INVENTION

1. Field of the Invention

This invention relates to a semiconductor memory device, and more particularly to a structure of a read/write control unit in a static random access memory.

2. Description of the Prior Art

Since a static random access memory requires a constant current to flow therethrough in contrast to a dynamic random access memory, it consumes a large amount of electric power. However, it requires no refreshing operations and can be operated at a high speed.

As is well known, a static random access memory formed of semiconductors includes generally a plurality of memory cells, each of which consists of a one-bit-signal memorizing flip-flop, are arranged like row and column matrixes; word lines connected to each row of the memory cells for the purpose of selecting a specific memory cell from the same memory cells, and bit lines connected to each column of the memory cells; a bit data line for connecting each column of the memory cells to a power source and a common data line; a write control circuit for writing data in the memory cells; and a read control circuit for reading data from the memory cells.

In order to form such a random access memory of semiconductor devices, such as MOS transistors, it is necessary to reduce the power dissipation.

There is a known method of reducing the power dissipation of such a static random access memory, in which an electric current flowing through a load MOS transistor on a bit data line between the memory cells and a power source is controlled (Japanese Patent Laid-open No. 132589/1980). This method consists of stopping the electric currents, which flow through the bit lines for the columns other than a selected column, by turning on and off by a column selecting signal such a load MOS transistor as mentioned above, so as to minimize the power dissipation of the memory.

However, when this method is used, an unnecessary constant current flows from a power source toward a data input circuit through a MOS transistor on a bit data line in a selected column during the write-in time, though a direct current does not flow into non-selected memory cells during the read-out time.

When this method is used, a difference between the electric potentials in two bit data lines at both sides of a memory cell in a non-selected column becomes several times as high as that in the case where a load MOS transistor is not turned off. Consequently when a selected word line is switched, incorrect turn-on or turn-off of the memory cell occurs.

For example, when the load MOS transistor is not turned off, both of the voltages in the two bit data lines during the read-out time are maintained at substantially the same level (about 3 V if the power source voltage is 5 V). On the other hand, when the load MOS transistor on the bit data line is turned off, the voltages in two bit data lines on the high level "H" side and low level "L" side of the memory cell differ greatly; when the power source voltage is 5 V, the voltage in the bit data line on the high level side becomes about 4 V, and the voltage in the bit data line on the low level side 0-1 V. If another word line is then selected with this load MOS transistor turned off, and if another column selecting signal is inputted at this time, a problem will occur. Namely, when the contents of a memory cell connected to these bit data lines and selected word line are contrary to those of the above-mentioned memory cell, the contents of the memory cell connected to the selected word line are written in the turned-over state due to the large difference between the voltages in the bit data lines.

SUMMARY OF THE INVENTION

An object of the present invention is to provide a semiconductor memory device which is free from these drawbacks encountered in a prior art semiconductor memory device, and which is capable of stopping the direct current flowing from a power source in a static random access memory, especially, during the write-in time, so as to reduce the power dissipation.

In order to achieve the above object, the present invention provides a static random access memory having word lines adapted to be driven by a decoder, bit lines connected to a power source through load transistors, a plurality of memory cells connected to the bit lines and word lines, and a data input buffer circuit into which the data to be written are inputted by a chip select signal and a write control signal, characterized in that a write control signal or a write enable signal generated by a logical product of the write control signal and a chip select signal is applied to the gate of a load transistor on a bit line so as to control the electric current, which flows through the same load transistor, by the write control signal or write enable signal.

In a preferred mode of embodiment of the present invention, a current control means is added to a semiconductor memory device of the above-described construction, the current control means being adapted to cut off an electric current, which flows to a sense amplifier and a pull-down transistor on a common data line, by a signal which varies simultaneously with the variation in the input address during a write cycle, whereby the power dissipation during the write-in time can be further reduced.

The above and other objects as well as advantageous features of the invention will become apparent from the following description of the preferred embodiments taken conjunction with the accompanying drawings.

DESCRIPTION OF THE PREFERRED EMBODIMENTS

Figure 1:
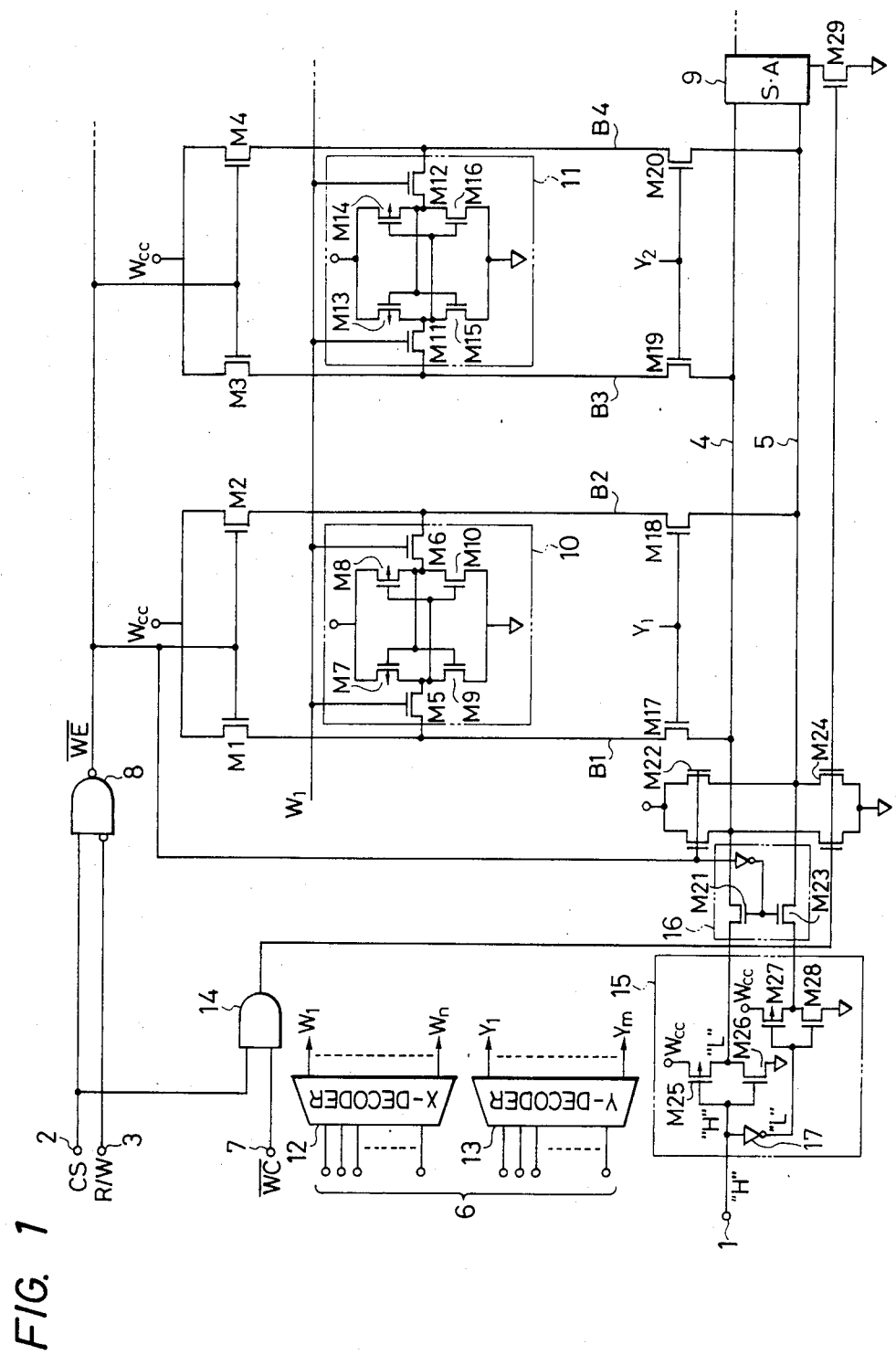
FIG. 1 shows the construction of an embodiment of a semiconductor memory device according to the present invention.

FIG. 1 is a circuit diagram of an example of a static random access memory constituting the semiconductor memory device according to the present invention.

Referring to the drawing, a NAND gate 8 and an AND gate 14 are the parts which constitute the characteristics of the present invention, and the remaining parts of the embodiment are identical with the corresponding parts of a known static random access memory. In order to describe the present invention understandably, the statement of a general operation of a random access memory will now be given.

Memory cells 10, 11 consist of flip-flop circuits composed of MOS transistors M7, M8, M9, M10; M13, M14, M15, M16, and adapted to store one bit, "0" or "1". These flip-flop circuits are connected to bit data lines B1, B2, B3, B4 through MOS transistor switches M5, M6, M11, M12, respectively. The gates of the MOS transistors which constitute the switches M5, M6, M11, M12 are all connected to a word line W1. Although only two memory cells are illustrated for simplifying the drawing, m pieces of memory cells are generally connected to one word line, and n pieces of memory cells to the bit lines B1, B2, respectively, so as to store m×n bit information. The bit lines B1, B2, B3, B4 are connected at one end each thereof to a power source Wcc through load transistors M1, M2, M3, M4, and at the other end each thereof to common data lines 4, 5 through bit line selecting transistors M17, M18, M19, M20. A memory cell, in which the data area to be written, or out of which the data are to be read, is selected as follows.

The address of a memory cell to be selected is decoded by an X-decoder 12 and a Y-decoder 13 through input terminals 6, and one of word lines $W_1-W_n$ and one set (two) of bit data lines $B_1-B_{2m}$ are selected. One set of the bit data lines $B_1-B_{2m}$ are selected by column selecting signals $Y_1-Y_m$.

One end of each of the common data lines 4, 5 is connected to a sense amplifier 9, and the other end of both thereof to common line pull-up transistors M21, M22 and common line pull-down transistors M23, M24, respectively, these transistors M21, M22; M23, M24 being connected to an input buffer circuit 15 through a write control circuit 16.

The construction of the above-described portion of the memory device is identical with that of a known static random access memory device. In the embodiment of FIG. 1, a chip selection signal CS and a read and write control signal R/W or an inverted signal of a write control signal, which are applied to input terminals 2, 3, respectively, are inputted into a NAND gate 8. By a write enable signal $\overline{WE}$ consisting of an output from the NAND gate 8, all of the load MOS transistors M1, M2, M3, M4 on the bit lines B1, B2, B3, B4 are turned off during the write-in time, and turned on in other cases.

The operations for retaining, reading and writing the information on, out of and in a memory cell will now be described with reference to the memory cell 10.

During an information retaining cycle K, in which neither the reading R nor the writing W of information is done, a high level signal is not applied to the word line $W_1$. Accordingly, MOS transistor switches M5, M6 as well as MOS transistor switches M17, M18 on the bit lines B1, B2 are opened, so that an unnecessary direct current does not flow.

When the information is read out of the memory cell 10, the level of electric current flowing in the word line $W_1$ is made high by the X-decoder to cause MOS transistor switches 5, 6 to be turned on. The level of electric current flowing in the word line $Y_1$ is made high by the Y-decoder 13, so that MOS transistor switches M17, M18 are turned on. The level of the write enable signal $\overline{WE}$ also becomes high to cause the load MOS transistors M1, M2 to be turned on.

A pair of pieces of high-level and low-level information stored in the memory cell 10 appear as a minute electric potential difference in the common data lines 4, 5. This minute electric potential difference is amplified by the sense amplifier 9 and transmitted to an output buffer circuit (not shown).

During the write-in time, the switch transistors M1, M2, M5, M6, M17, M18 connected to the selected memory cell 10 are turned on in the same manner as in a reading cycle.

The data to be memorized are applied from an input terminal 1 to the write control circuit 16 through the input data buffer circuit 15. If the data to be memorized are high-level "H" data, the level of one portion thereof becomes low "L" through CMOS transistors M25, M26, and the other portion thereof is inverted by an inverter 17, so that the level of this portion of the data becomes low "L", which becomes high "H" again through CMOS transistors M27, M28. The resultant signals as signals having a large electric potential difference are outputted to the common data lines 4, 5.

Figure 2:
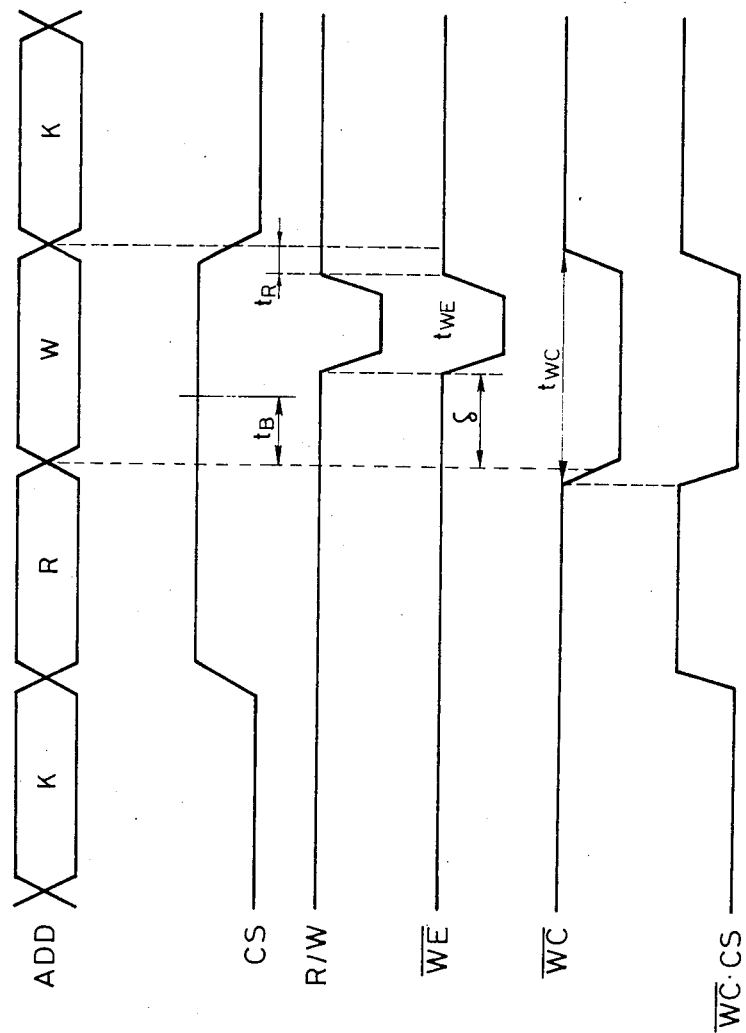
FIG. 2 is a time chart used to describe a principal portion of the embodiment.

As shown in FIG. 2, a chip select signal CS is inputted at the read-out time and write-in time simultaneously with the rising of an address signal ADD, and cut off simultaneously with the falling thereof. A read/write signal R/W is applied after the time $t_B$, during which an address signal ADD for carrying out a writing action reliably is inputted to select one word line, has elapsed. The signal R/W then returns to a high level the time $t_R$ before a subsequent address signal ADD is inputted.

Accordingly, during an initial period of time $t_B$ in a write-in cycle, a direct current flows from the power source Wcc into the memory cells 10, 11, which are connected to the selected word line W1, through the load MOS transistors on the bit lines. During the write-in time, a chip select signal CS and a read/write control signal R/W are inputted into the NAND gate 8 as shown in FIG. 1 to obtain a write enable inverted signal $\overline{WE}$. When this signal $\overline{WE}$, i.e. a logical product of the chip select signal CS and write control signal is applied to the gates of the load MOS transistors M1-M4 on the bit lines, all of these transistors are turned off during the write-in time. As a result, the direct current flowing into the selected memory cell 10 and non-selected memory cell 11 is cut off.

During the write-in time, a direct current flows from the power source Wcc to a ground voltage through the load MOS transistors M1-M4 on the bit lines, bit lines B1-B4, switch MOS transistors M17-M20, common data line 4 or 5, and MOS transistor M26 or M28 in the data input circuit 15. However, since MOS transistors M1-M4 on the bit lines are turned off by an inverted write enable signal $\overline{WE}$ as shown in FIG. 1, the direct current is cut off.

Referring to FIG. 1, the electric current flowing into the pull-up transistors M21, M22 on the common data lines is also controlled by the inverted write enable signal $\overline{WE}$ and turned off during the write-in time in the same manner as the load MOS transistors M1-M4 on the bit lines, so that the direct current is cut off perfectly.

During the write-in time, signals having a large electric potential difference transmitted from the data input buffer circuit 15 appear in the common data lines 4, 5, and the writing of data into a selected memory cell can be done by a transient current alone which is based on the electric potential difference. Therefore, a high flow rate of a direct current is not required. In the embodiment of FIG. 1, the cutting of this electric current does not have any bad influence upon the writing action. Since the sense amplifier 9, which is connected to the common data lines 4, 5, is used in the read-out time alone, it may be cut off during the write in time.

In a static random access memory, which uses no clocks, it is necessary that a precharging current be applied thereto at the read-out time. Therefore, the direct current flowing during the read-out time cannot be cut off.

According to the embodiment, the direct current can be cut off during the write-in time by merely controlling by the write enable signal $\overline{WE}$ the electric current flowing through the load transistors on the bit lines, so that the power dissipation of a static random access memory can be minimized by a very simple method.

Among the static random access memory devices, a static random access memory device having a peripheral circuit which consists of a dynamic circuit, it is necessary that the power dissipation thereof be minimized by a clock. This causes the circuit and the timing of a control signal to be complicated, and the access time to be delayed.

As shown in FIG. 2, in the static random access memory device according to the present invention, the address does not vary while the load transistors on the bit lines are in an OFF-state. Consequently, there is no possibility that the condition of the flip-flop in a memory cell is reversed when the word line is switched.

In the circuit of FIG. 1, the AND-gate 14 is a circuit for further reducing the power dissipation during the write-in time. The sense amplifier 9, pull-down transistors M23, M24 and pull-up transistors M21, M22 are not needed during the write cycle. Even when the amplifier 9 and transistors M21–M24 are controlled by the write enable signal $\overline{WE}$, the time required therefor is shorter than that of a write cycle.

Thus, the AND-gate 14 serves to reduce the power dissipation of the sense amplifier and pull-up and pull-down transistors during a write cycle.

A chip select signal CS and a write cycle signal $\overline{WC}$ are applied to the AND-gate 14 through the input terminals 2, 7, respectively. As shown in FIG. 2, the write cycle signal $\overline{WC}$ is a signal the level of which becomes low only during the time $t_{WC}$. Accordingly, the level of an output $\overline{WC}\cdot CS$ from the AND-gate 14 becomes high in a read cycle but suddenly low in a write cycle, so that the current passages in a transistor M29 in the sense amplifier 9 and pull-down transistors M23, M24 on the common data lines are closed.

According to this embodiment, the pull-down transistors M23, M24 and the transistor M29 in the current passage in the sense amplifier are turned off during the time $\delta = t_{WC} - t_{WE}$ in spite of the fact that this time is in a write cycle. Consequently, the quantity of electric current, i.e. the power dissipation decreases correspondingly.

Figure 3:
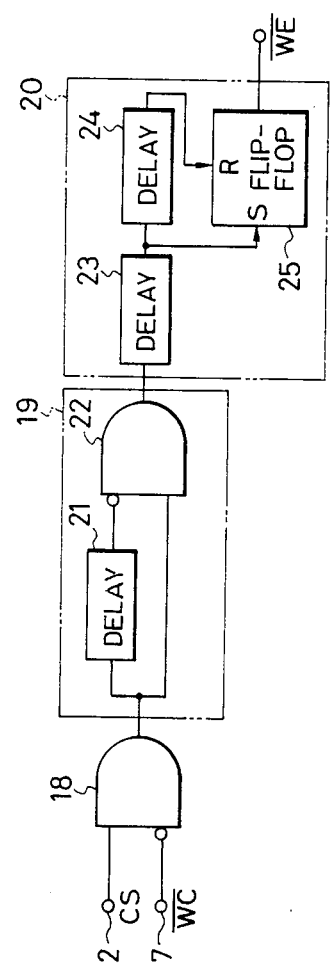
FIG. 3 shows a write enable signal generating circuit used in another embodiment of the semiconductor memory device according to the present invention.

FIG. 3 shows another example of the circuit for generating a write enable signal $\overline{WE}$. The circuit of FIG. 3 is used in place of the NAND gate 8 shown in FIG. 1, and, especially, when the AND gate 14 shown in FIG. 1 is used. A write enable signal $\overline{WE}$ is generated by using a chip select signal CS and a write cycle signal $\overline{WC}$. When this circuit is used, it is not necessary to supply a write enable signal $\overline{WE}$ and read/write signal R/W from the outside.

It is necessary that the level of a write enable signal $\overline{WE}$ becomes low a period of time $\delta$ after the rising of a write cycle, and high a period of time $t_{WE}$ later, as shown in FIG. 2. Accordingly, a signal of a product of a negative output of a write cycle signal $\overline{WC}$ and a chip enable signal CS is obtained at the AND gate 18. A variation point detecting circuit 19 is a circuit for detecting a point, at which the level of a write cycle varies, on the basis of an output from an AND-gate 18. The circuit 19 consists of an AND-gate 22 which is adapted to receive as an input an output signal from the AND-gate 18 and a signal obtained by delaying this output signal by a delay circuit 21 and reversing the polarity of the delayed signal. An output from the AND-gate 22 is delayed by a period of time $\delta$ by a delay circuit 23, and part of the resultant signal is applied as a set signal to the set terminal S of a flip-flop 25, the remaining part thereof being further delayed by a period of time $t_{WE}$ by a delay circuit 24 and applied to a reset terminal R of the flip-flop 25. Consequently, a write enable signal $\overline{WE}$ shown in FIG. 2 is generated at an output terminal of the flip-flop.

The present invention has been described on the basis of its embodiments, and it is not limited to the same embodiments.

We claim:

1. A semiconductor memory device comprising:
   a plurality of word lines;
   a plurality of bit lines each connected to a power source through respective load transistors;
   a plurality of memory cells connected to said word lines and said bit lines;
   a data input circuit for receiving data and transmitting the data to the memory cells for storage;
   a pair of data lines connected in common to the data input circuit, the bit lines, and a sense amplifier; and
   a switching circuit including means to turn off all of the respective load transistors when the data is being written in the memory cells, wherein the switching circuit has a first logic circuit for generating an output signal corresponding to the logical product of a chip select signal and an inverted write cycle signal, a second logic circuit receiving the output signal from the first logic circuit and generating an output signal corresponding to variations in the output signal from the first logic circuit, a first delay circuit for delaying the output signal from the second logic circuit by a predetermined time, a second delay circuit for further delaying the delayed signal from the first delay circuit by a time determined by the time required for storing data in the memory cells, and a flip-flop circuit receiving the outputs of the first and second delay circuits as a set and a reset input, respectively, and generating a signal which is fed to the load transistors to turn off the load transistors when data is being written in the memory cells.

2. A semiconductor memory device according to claim 1, having a plurality of pull-down transistors respectively connected to the sense amplifier and the data lines, and a circuit for generating a signal, being a logical product of said chip select signal and said write cycle signal, for turning off the pull-down transistors simultaneously with variation of input addresses during a write cycle.

3. A semiconductor memory device according to claim 1, wherein said load transistors are MOS transistors each of which has its source-drain path connected in series along said bit lines between said memory cells and said power source and its gate coupled to receive the output signal of said flip-flop circuit.

* * * * *